US008149063B2

(12) United States Patent
Ueda

(10) Patent No.: US 8,149,063 B2
(45) Date of Patent: Apr. 3, 2012

(54) CURRENT-RESTRICTION CIRCUIT AND DRIVING METHOD THEREFOR

(75) Inventor: Yuuichi Ueda, Ikeda (JP)

(73) Assignee: Ricoh Company, Ltd., Tokyo (JP)

(*) Notice: Subject to any disclaimer, the term of this patent is extended or adjusted under 35 U.S.C. 154(b) by 358 days.

(21) Appl. No.: 12/555,107

(22) Filed: Sep. 8, 2009

(65) Prior Publication Data

US 2010/0060249 A1 Mar. 11, 2010

(30) Foreign Application Priority Data

Sep. 10, 2008 (JP) ................................ 2008-232344

(51) Int. Cl.
*H03F 3/08* (2006.01)

(52) U.S. Cl. ......................... 330/308; 330/279; 323/234

(58) Field of Classification Search .................. 330/105, 330/252, 260, 279, 264, 302; 323/270, 280, 323/311–316, 354; 327/147, 156–159, 535; 307/279, 296

See application file for complete search history.

(56) References Cited

U.S. PATENT DOCUMENTS

| | | | | |
|---|---|---|---|---|
| 4,451,779 | A * | 5/1984 | Griep | 323/312 |
| 4,553,084 | A * | 11/1985 | Wrathall | 323/316 |
| 5,159,516 | A * | 10/1992 | Fujihira | 361/18 |
| 5,486,791 | A * | 1/1996 | Spitalny et al. | 330/282 |
| 6,137,366 | A * | 10/2000 | King | 330/298 |
| 7,760,524 | B2 * | 7/2010 | Matthews | 363/46 |

FOREIGN PATENT DOCUMENTS

| | | |
|---|---|---|
| JP | 2-181663 | 7/1990 |
| JP | 4-223508 | 8/1992 |
| JP | 2003-333831 | 11/2003 |
| JP | 3606994 | 10/2004 |
| JP | 3644156 | 2/2005 |
| JP | 2006-48394 | 2/2006 |
| JP | 2009-44870 | 2/2009 |

OTHER PUBLICATIONS

U.S. Appl. No. 12/404,902 of Yuuichi Ueda, filed Mar. 16, 2009.

* cited by examiner

*Primary Examiner* — Rajnikant Patel
(74) *Attorney, Agent, or Firm* — Cooper & Dunham LLP

(57) ABSTRACT

A current-restriction circuit includes an input terminal to which an input voltage is input, an output terminal from which an output voltage is output, a driver transistor connected to the input terminal as well as the output terminal, a sense transistor connected to the output terminal as well as the input terminal via a sense resistor, a first operational amplifier circuit, and a bias-voltage change circuit. Control terminals of the driver transistor and the sense transistor are connected together and connected to an output terminal of the first operational amplifier circuit. The first operational amplifier circuit receives both a bias voltage with reference to an electrical potential at the input terminal and a decrease in a voltage at the sense resistor. The bias-voltage change circuit keeps the bias voltage below a predetermined bias voltage according to a voltage difference between the input voltage and the output voltage.

12 Claims, 7 Drawing Sheets

CURRENT-RESTRICTION CIRCUIT AND DRIVING METHOD THEREFOR

CROSS-REFERENCE TO RELATED APPLICATIONS

This patent specification is based on and claims priority from Japanese Patent Application No. 2008-232344, filed on Sep. 10, 2008 in the Japan Patent Office, which is hereby incorporated by reference herein in its entirety.

BACKGROUND OF THE INVENTION

1. Field of the Invention

The present invention generally relates to a current-restriction circuit for a whole category of electronic equipment aboard a computerized personal organizer, a handset, a voice recognition device, a voice memory device, or a computer, etc.

2. Discussion of the Background

A configuration of known current-restriction circuits is described below with reference to FIG. 12.

Referring to FIG. 12, a known current-restriction circuit 100Z includes a driver transistor M1Z, a sense transistor M2Z, an operational amplifier circuit 1Z, a current source I1Z, a sense resistor Rsns, a bias resistor Rbi, an input terminal IN, a ground terminal GND, and an output terminal OUT. An input voltage Vi is input to the input terminal IN, and a load 20Z is connected between the output terminal OUT and the ground terminal GND.

The driver transistor M1Z includes a drain connected to the input terminal IN, a source connected to the output terminal OUT, and a gate connected to an output terminal of the operational amplifier circuit 1Z. A drain of the sense transistor M2Z is connected to a non-inverting input terminal of the operational amplifier circuit 1Z as well as the input terminal IN via the sense resistor Rsns. A source and a gate of the sense transistor M2Z are respectively connected to the source and the gate of the driver transistor M1Z.

The size of the sense transistor M2Z is set to a value obtained by dividing the size of the driver transistor M1Z by several tens or several thousands. An inverting input terminal of the operational amplifier circuit 1Z is connected to a junction node between the bias resistor Rbi and the current source I1Z.

The bias resistor Rbi is connected between the input terminal IN and the inverting input terminal of the operational amplifier circuit 1Z. The current source I1Z is connected to the inverting input terminal of the operational amplifier circuit 1Z and the ground terminal GND. It is to be noted that, in this specification, "current" means "electrical current" unless otherwise specified.

Operations of the known current restriction circuit 100Z are described below with reference to FIG. 12.

The current restriction circuit 100Z adjusts an output current Io supplied to the load 20Z via the driver transistor M1Z within a certain range. When the output current Io is supplied to the load 20Z via the driver transistor M1Z, a sense current Isns proportional to a drain current Id of the driver transistor M1Z flows to the sense transistor M2Z. When the size ratio of the driver transistor M1Z to the sense transistor M2Z is K:1, the sense current Isns is obtained by dividing the drain current Id by K.

As the sense current Isns of the sense transistor M2Z flows to the sense resistor Rsns, a sense voltage Vsns is generated in the sense resistor Rsns. The sense voltage Vsns increases as the output current Io increases. Accordingly, the electrical potential at the non-inverting input terminal of the operational amplifier circuit 1Z decreases as the output current Io increases. When the electrical potential at the non-inverting input terminal of the operational amplifier circuit 1Z is lower than the electrical potential at the inverting input terminal thereof, the output from the operational amplifier circuit 1Z decreases. Accordingly, the electrical potential at the gate of the driver transistor M1Z decreases, and then the impedance of the driver transistor M1Z increases. As a result, the output current Io is restricted to a current value at which the voltage at the non-inverting input terminal equals the voltage at the inverting input terminal.

Meanwhile, the voltage between the input voltage Vi and the inverting input terminal of the operational amplifier circuit 1Z, which is hereinafter referred to as a bias voltage Vbias, is determined by a decrease in the voltage in the bias resistor Rbi. The bias voltage Vbias is a constant voltage determined by multiplying the value of the bias resistor Rbi with that of the current source I1Z. In other words, a restricted value or maximum value (hereinafter "limited current" Ilim) of the output current Io is a current value when the sense voltage Vsns equals the bias voltage Vbias. The limited current Ilim can be expressed by formula 1 shown below.

$$Ilim=Vbias(Rd+Rs)/(Rd\cdot Rsns) \quad (1)$$

wherein Rd represents the impedance of the driver transistor M1Z, Rs represents the impedance of the sense transistor M2Z, and Rsns represents the resistance of the sense resistor.

The above-described known configuration has a drawback in that it is possible that the output current Io increases above the limited current Ilim when the difference between the input voltage Vi and the output voltage Vo (hereinafter "voltage difference Vi−Vo") is relatively small. This undesirable phenomenon is described in further detail below.

FIG. 13 illustrates the relation between voltage and current in the known current-restriction circuit 100Z shown in FIG. 12. In FIG. 13, a graph (A) shows changes in the sense voltage Vsns and the bias voltage Vbias, in which a vertical axis indicates voltage and a horizontal axis indicates the voltage difference Vi−Vo. The input voltage Vi serves as a reference voltage and the voltage decreases the further it goes down in the graph (A). A graph (B) shows changes in the output current To, and a horizontal axis and a vertical axis therein indicate the voltage difference Vi−Vo and output current Io, respectively.

In the graph (A) shown in FIG. 13, the bias voltage Vbias is the voltage at the junction node between the bias resistor Rbi and the current source I1Z, the sense voltage Vsns is the voltage at a junction node between the sense resistor Rsns and the sense transistor M2Z, and reference character Vbias0 represents a predetermined or given bias voltage. The predetermined bias voltage Vbias0 is a value of the bias voltage Vbias when all the current from the current source I1Z flows to the bias resistor Rbi.

Herein, the sense current Isns can be expressed by formula 2 shown below when the voltage difference Vi−Vo is relatively small and the sense voltage Vsns is lower than the bias voltage Vbias even when the sense transistor M2Z is turned on.

$$Isns=(Vi-Vo)/(Rsns+Rs0) \quad (2)$$

wherein Rd0 represents an on resistance of the driver transistor M1Z, Rs0 represents an on resistance of the sense transistor M2Z, and Rpara represents a wiring resistance of wiring from the input terminal IN through the driver transistor M1Z to the output terminal OUT, indicated by dotted lines shown in FIG. 12.

The sense voltage Vsns in this state can be expressed by formula 3 shown below.

$$Vsns=Rsns \cdot Isns=Rsns(Vi-Vo)/(Rsns+Rs0) \quad (3)$$

From the formula 3, it is known that the sense voltage Vsns is 0 V when the voltage difference Vi−Vo is 0 V and increases in proportion to the voltage difference Vi−Vo.

In addition, as a constant current is supplied to the bias resistor Rbi from the current source I1Z regardless of the voltage difference Vi−Vo, the bias voltage Vbias is constantly at the predetermined bias current Vbias0.

The output from the operational amplifier circuit 1Z is high until the sense voltage Vsns becomes equal to the predetermined bias voltage Vbias0, and accordingly the driver transistor M1Z is on during this time period. The drain current Id of the driver transistor M1Z in this state can be expressed by formula 4 shown below.

$$Id=(Vi-Vo)/(Rd0+Rpara) \quad (4)$$

Because the output current Io is the sum of the sense current Isns and the drain current Id, the output current Io can be obtained by the following formula 5 using the formulas 2 and 4 described above.

$$Io=(Vi-Vo)/(Rsns+Rs0)+(Vi-Vo)/(Rd0+Rpara) \quad (5)$$

In the formula 3 described above, the voltage difference Vi−Vo at which the output current Io is maximum is obtained when the sense voltage Vsns equals the predetermined bias voltage Vbias0. Therefore, the following formula 6 can be obtained when the sense voltage Vsns is replaced with the predetermined bias voltage Vbias0 in the formula 3, and then the formula 3 is solved for the voltage difference Vi−Vo.

$$Vi-Vo=Vbias0(Rsns+Rs0)/Rsns \quad (6)$$

That is, the right-hand side of the formula 6 is the difference voltage Vi−Vo at which the output current Io is maximum. Then, the maximum value of the output current Io (hereinafter "maximum output current Imax") can be found by substituting the formula 6 into the formula 5.

$$Imax=Vbias0(Rd0+Rpara+Rsns+Rs0)/Rsns(Rd0+Rpara) \quad (7)$$

When the voltage difference Vi−Vo is relatively large, the gates of the driver transistor M1Z and the sense transistor M2Z are controlled by the operational amplifier circuit 1Z, and then the sense voltage Vsns constantly equals the predetermined bias voltage Vbias0. Thus, the sense current Isns can be expressed by formula 8 shown below.

$$Isns=Vbias0/Rsns \quad (8)$$

The drain current Id of the driver transistor M1Z can be expressed by formula 9 shown below.

$$Id=K \cdot Isns=K \cdot Vbias0/Rsns \quad (9)$$

wherein K represents the size ratio of the driver transistor M1Z to the sense transistor M2Z.

Because the output current Io is the sum of the sense current Isns, expressed by the formula 8, and the drain current Id of the driver transistor M1Z, expressed by the formula 9, the output current Io can be expressed by formula 10 shown below.

$$Io=Vbias0(1+K)/Rsns \quad (10)$$

Herein, the graph (B) shown in FIG. 13 illustrates the formulas 5 and 10 when the on resistance Rd0 of the driver transistor M1Z is 0.1Ω, the on resistance Rs0 of the sense transistor M2Z is 1Ω, the wiring resistance Rpara is 0.1Ω, the sense resistor Rsns has a resistance of 5Ω, and the bias voltage Vbias is 0.1 V. In the graph (B) shown in FIG. 13, reference character VI represents a value of the voltage difference Vi−Vo at which the output current Io is at the maximum output current Imax.

After the voltage difference Vi−Vo exceeds the voltage V1, the output current Io does not immediately equal the limited current Ilim due to effects such as channel length modulation caused by the drain voltages of the sense transistor M2Z and the driver transistor M1Z differing slightly.

When the above-described parameters are substituted into the formula 1, the limited current Ilim is 0.22 A. Similarly, the maximum output current Imax is 0.62 A according to the formula 7, and the voltage V1 is 0.12 V according to the formula 3. Thus, it is possible that the maximum output current Imax can nearly triple the limited current Ilim.

When the maximum output current Imax is larger than the limited current Ilim, the following inconvenience is caused.

To design devices using the current-restriction circuit, designers must consider the possibility that, depending on a sequence of fluctuations in the load, the output current Io may increase to the maximum output current Imax even though the specified rated current is the limited current Ilim. That is, an allowable load current of the power source provided on the upstream side in the system should be increased, and the width of substrate wiring on the upstream side as well as the downstream side should be increased.

Therefore, there is a need to provide a current-restriction circuit that reduces the difference between the maximum output current Imax and the limited current Ilim, which the known current-restriction circuits fail to do.

SUMMARY OF THE INVENTION

In view of the foregoing, in one illustrative embodiment of the present invention, a current-restriction circuit includes an input terminal to which an input voltage is input, an output terminal from which an output voltage is output, a driver transistor, a sense transistor, a first operational amplifier circuit, and a bias-voltage change circuit. The driver transistor includes a first end connected to the input terminal, a second end connected to the output terminal, and a control terminal. The sense transistor includes a first end connected to the input terminal via a sense resistor, a second end connected to the output terminal, and a control terminal connected to the control terminal of the driver transistor. The first operational amplifier circuit receives both a bias voltage with reference to an electrical potential at the input terminal and a decrease in a voltage at the sense resistor. An output terminal of the first operational amplifier circuit is connected to the control terminals of the driver transistor and the sense transistor. The bias-voltage change circuit keeps the bias voltage below a predetermined bias voltage according to a voltage difference between the input voltage and the output voltage.

Another illustrative embodiment of the present invention provides a method of driving a current-restriction circuit that includes an input terminal to which an input voltage is input, an output terminal from which an output voltage is output, a driver transistor having a first end connected to the input terminal, a second end connected to the output terminal, and a control terminal, a sense transistor having a first end connected to the input terminal via a sense resistor, a second end connected to the output terminal, and a control terminal connected to the control terminal of the driver transistor, and a first operational amplifier circuit to receive both a bias voltage with reference to an electrical potential at the input terminal is input and a decrease in a voltage at the sense resistor. An output terminal of the operational amplifier circuit is connected to the control terminals of the driver transistor and the sense transistor.

The method includes keeping the bias voltage below a predetermined bias voltage according to a voltage difference between the input voltage and the output voltage.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
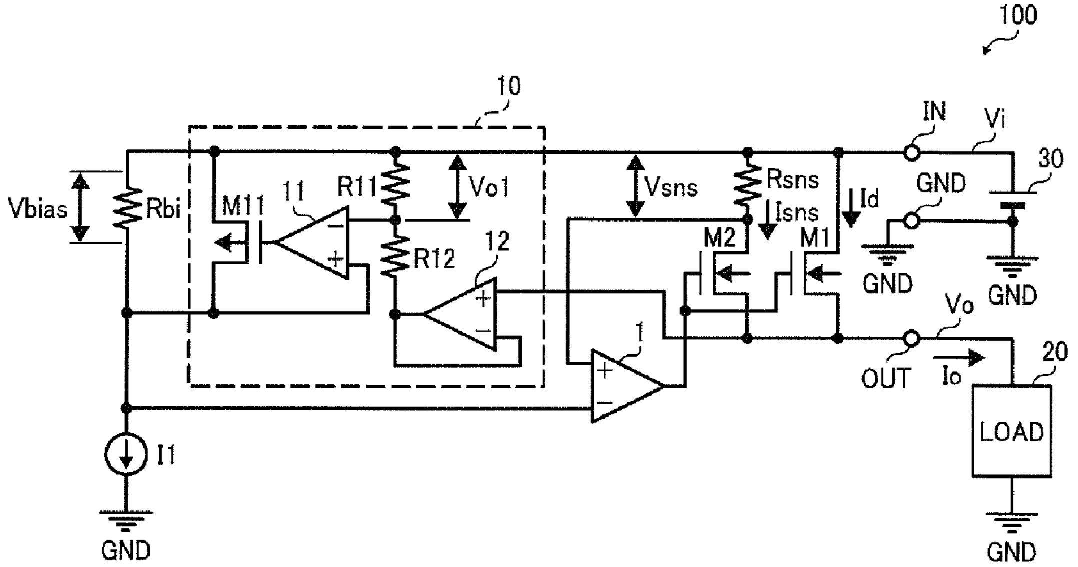
FIG. 1 illustrates circuitry of a current-restriction circuit according to an illustrative embodiment of the present invention.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referring now to the drawings, wherein like reference numerals designate identical or corresponding parts throughout the several views thereof, and particularly to FIG. 1, a configuration of a current-restriction circuit according to an illustrative embodiment of the present invention is described.

Referring to FIG. 1, a current-restriction circuit 100 includes a driver transistor M1, a sense transistor M2, an operational amplifier circuit 1 serving as a first 10 operational amplifier circuit, a current source I1, a sense resistor Rsns, a bias resistor Rbi, an input terminal IN, a ground terminal GND, and an output terminal OUT. An input voltage Vi is input to the input terminal IN, and a load 20 is connected between the output terminal OUT and the ground terminal GND.

The driver transistor M1 includes a drain (first end) connected to the input terminal IN, a source (second end) connected to the output terminal OUT, and a gate (control terminal) connected to an output terminal of the operational amplifier circuit 1. A drain (first end) of the sense transistor M2 is connected to a non-inverting input terminal (second input terminal) of the operational amplifier circuit 1 as well as the input terminal IN via the sense resistor Rsns. A source (second end) and a gate (control terminal) of the sense transistor M2 are respectively connected to the source and the gate of the driver transistor M1. The gate of the sense transistor M2 is also connected to the output terminal of the operational amplifier circuit 1.

A first end of the bias resistor Rbi is connected to the input terminal. An inverting input terminal (first input terminal) of the operational amplifier circuit 1 is connected to a junction node between the current source I1 and a second end of the bias resistor Rbi. A bias voltage Vbias is applied to the both ends of the bias resistor Rbi. Thus, the bias voltage Vbias is input to the inverting input terminal of the operational amplifier circuit 1, and a decrease in the sense voltage Vsns is input to the non-inverting input terminal thereof.

Figure 12:
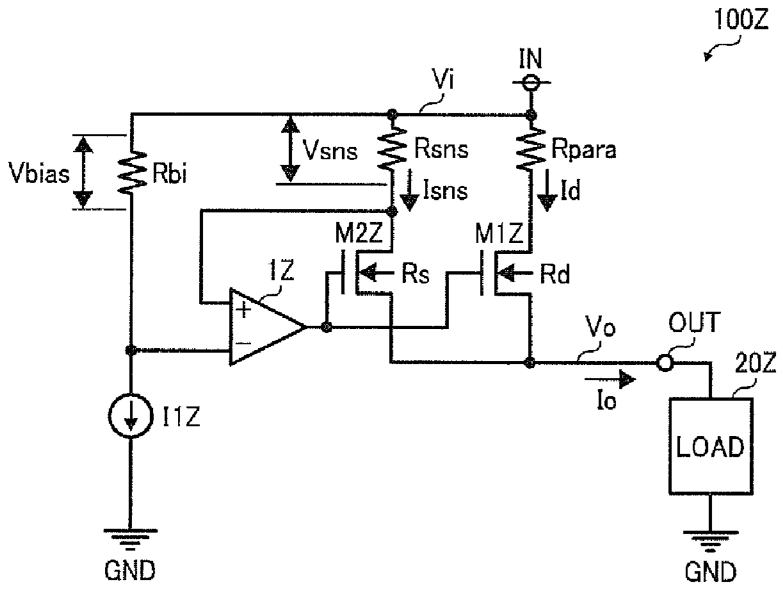
FIG. 12 RELATED ART
FIG. 12 illustrates circuitry of a known current-restriction circuit.
Figure 13:
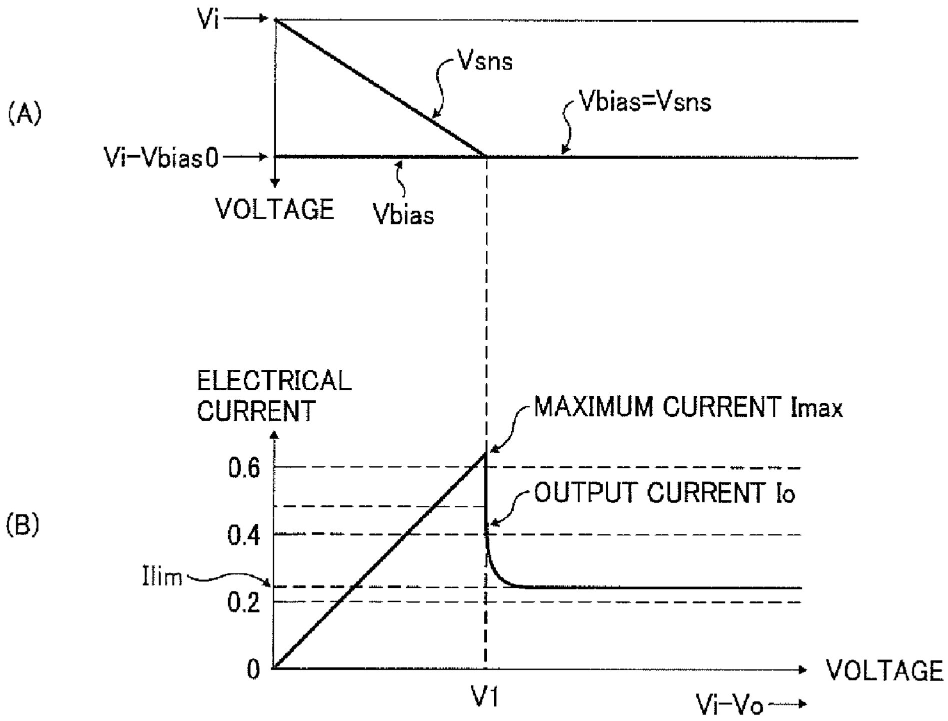
FIG. 13 RELATED ART
FIG. 13 illustrates the relation between voltage and current in the known current-restriction circuit shown in FIG. 12: A graph (A) shows changes in the sense voltage Vsns and the bias voltage Vbias, and a graph (B) shows changes in the output current Io.

The current-restriction circuit 100 further includes a bias-voltage change circuit 10 to change the bias voltage Vbias based on the difference between the input voltage Vi and the output voltage Vo (hereinafter "voltage difference Vi−Vo"). It is to be noted that other then the bias-voltage change circuit 10, the current-restriction circuit 100 has a configuration similar to that of the current restriction circuit 100Z shown in FIG. 12, and thus the description thereof is omitted.

The bias-voltage change circuit 10 includes operational amplifier circuits 11 and 12, PMOS (P-channel Metal Oxide Semiconductor) transistor M11, and resistors R1 and R12 forming a first resistor. The PMOS transistor M1 serving as a variable impedance element or first MOS transistor is connected in parallel to the bias resistor Rbi. Its source is connected to the input terminal IN, and its drain is connected to a junction node between the bias resistor Rbi and the current source I1. A gate of the PMOS transistor M11 is connected to an output terminal of the operational amplifier circuit 11 serving as a second operational amplifier circuit. A non-inverting input terminal of the operational amplifier circuit 11 is connected to the drain of the PMOS transistor M11, and its inverting input terminal is connected to a junction node between the resistors R11 and R12. The other end of the resistor R11 is connected to the input terminal IN, and the other end of the resistor R12 is connected to an output terminal of the operational amplifier circuit 12. An inverting input terminal of the operational amplifier circuit 12 is connected to its output terminal, and its non-inverting input terminal is connected to the output terminal OUT.

The current-restriction circuit 100 adjusts an output current Io that flows through the output terminal OUT within a predetermined or given range.

Next, operations of the bias-voltage change circuit 10 are described below.

As the operational amplifier circuit 12 forms a voltage follower circuit, the output voltage therefrom is identical or similar to the input voltage thereto, that is, the voltage at the output terminal OUT. The resistors R11 and R12 are serially connected between the input terminal IN and the output terminal of the operational amplifier circuit 12. Therefore, the voltage at the junction node between the resistors R11 and R12 is a voltage obtained by dividing the voltage difference Vi−Vo with the resistances (hereinafter "resistances R11 and R12") of the resistors R11 and R12.

A drop (hereinafter "drop voltage Vo1") in the voltage of the resistor R11 can be expressed by formula 11 shown below.

$$Vo1=(Vi-Vo)\cdot R11/(R11+R12) \tag{11}$$

When R11/(R11+R12) is replaced with I/N, formula 12 shown below can be obtained from the formula 11 shown above.

$$Vo1=(Vi-Vo)/N \tag{12}$$

Because the drop voltage Vo1 is input to the inverting input terminal of the operational amplifier circuit 11, the operational amplifier circuit 11 controls the gate voltage of the PMOS transistor 11 so that the bias voltage Vbias equals the drop voltage Vo1. In other words, the bias voltage Vbias is adjusted to the drop voltage Vo1.

$$Vbias=Vo1=(Vi-Vo)/N \tag{12'}$$

However, the bias resistor Rbi is connected in parallel to the PMOS transistor M11, and moreover, any current exceeding the constant current by the current source I1 does not flow to the PMOS transistor M11 and the bias resistor Rbi. Therefore, the maximum value of the bias voltage Vbias will not exceed a predetermined or given bias Vbias0 that is determined by multiplying the resistance of the resistor Rbi by the current value of the current source I1. The predetermined bias voltage Vbias0 is a value of the bias voltage Vbias when all the current from the current source I1Z flows to the bias resistor Rbi.

Figure 2:
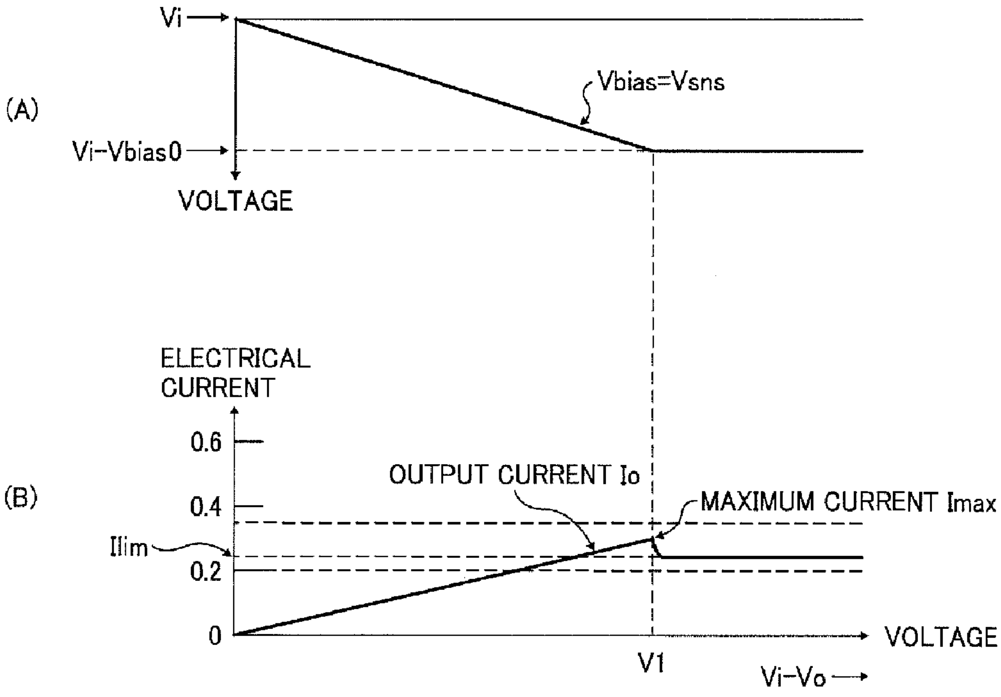
FIG. 2 illustrates the relation between voltage and current in the current-restriction circuit shown in FIG. 1: A graph (A) shows changes in the sense voltage Vsns and the bias voltage Vbias, and a graph (B) shows changes in the output current Io.

FIG. 2 illustrates the relation between voltage and current in the current-restriction circuit 100 shown in FIG. 1. In FIG. 2, a horizontal axis indicates the voltage difference Vi−Vo. A graph (A) shows changes in the sense voltage Vsns and the bias voltage Vbias. In the graph (A), the input voltage Vi serves as a reference voltage, and a vertical axis indicates voltage, which decreases the further it goes down.

A graph (B) shows changes in the output current Io, and a vertical axis therein indicates electrical current. Reference characters V1 represent a value of the voltage difference Vi−Vo at which the output current Io is maximum (maximum output current Imax).

In the graph (A) shown in FIG. 2, the bias voltage Vbias is the voltage at the junction node between the bias resistor Rbi and the current source I1, and the sense voltage Vsns is the voltage at a junction node between the sense resistor Rsns and the sense transistor M2.

Hereinafter, reference characters Rd0 represents an on resistance of the driver transistor M1, and Rs0 represents an on resistance of the sense transistor M2. In addition, reference character Rpara represents a wiring resistance of wiring from the input terminal IN through the driver transistor M1 to the output terminal OUT, although not shown in FIG. 1.

The operational amplifier circuit 1 adjusts the gate voltage of the sense transistor (NMOS transistor) M2 so that the sense voltage Vsns is constantly identical to the bias voltage Vbias. Therefore, as shown in the graph (A) shown in FIG. 2, the sense voltage Vsns and the bias voltage Vbias are constantly identical.

The sense current Isns can be expressed by formula 13 shown below.

$$Isns=Vbias/Rsns \tag{13}$$

The drain current Id of the driver transistor M1 can be expressed by the formula 9 described above (Id=K·Isns=K·Vbias0/Rsns).

In the present embodiment, the maximum output current Imax can be obtained from formula 7' shown below similarly to the above-described formula 7.

$$Imax=Vbias(Rd0+Rpara+Rsns+Rs0)/Rsns(Rd0+Rpara) \tag{7'}$$

Although it is known that the maximum output current Imax is proportional to the bias voltage Vbias from the formula 7' shown above, it is known that the bias voltage Vbias depends on a factor "N" that divides the voltage difference Vi−Vo from the formula 12' shown above. Therefore, when the voltage difference Vi−Vo is relatively small, the bias voltage Vbias can be smaller by setting the factor N properly. As a result, the maximum output current Imax can be reduced.

The graph (B) shown in FIG. 2 shows the solution of the formula 9 when the on resistance Rd0 of the driver transistor M1 is 0.1Ω, the on resistance Rs0 of the sense transistor M2 is 1Ω, the wiring resistance Rpara is 0.1Ω, the sense resistor Rsns has a resistance of 5Ω, the bias voltage Vbias is 0.1 V, and the factor N is 2.

When the above-described parameters are substituted into the formula 1, Ilim=Vbias (Rd+Rs)/(Rd·Rsns), the limited current Ilim is 0.22 A. The maximum output 10 current Imax is obtained when the bias voltage Vbias equals the predetermined bias voltage Vbias0. At that time, the voltage V1, which is a value of the voltage difference Vi−Vo, is the value when the drop voltage Vo1 in the formula 12 equals the predetermined bias voltage Vbias0. Therefore, the voltage V1 can be expressed as V1=Vbias0×N=0.2 V. Although the maximum output current Imax at that time should equal the limited current Ilim ideally, the maximum output current Imax is slightly higher than the limited current Ilim as shown in the graph (B) in FIG. 2 in practice because the drain voltage of the driver transistor M1 is higher than the drain voltage of the sense transistor M2 by the predetermined bias voltage Vbias0.

In addition, although the voltage difference V1 approaches the predetermined bias voltage Vbias0 (0.1 V) as the factor N approaches 1, the maximum output current Imax increases due to the channel modulation effects. By contrast, because the channel modulation effects decreases as the factor N increases, the maximum output current Io approaches the limited current Ilim. However, the voltage difference V1 at which the output current Io reaches the limited current Ilim increases. Therefore, the factor N should be set to a proper value depending on the specification of the circuit for which the current-restriction circuit is used.

As described above, in the present embodiment, the bias-voltage change circuit 10 can adjust the bias voltage Vbias to a value lower than the predetermined bias voltage (Vi−Vbias0) according to the voltage difference (Vi−Vo) between the input terminal and the output terminal. Therefore, even in the range where the voltage difference is smaller, the maximum value of the output current Io can be adjusted to a value similar to or lower than the limited current Ilim.

Another embodiment is described below with reference to FIGS. 3 and 4.

Figure 3:
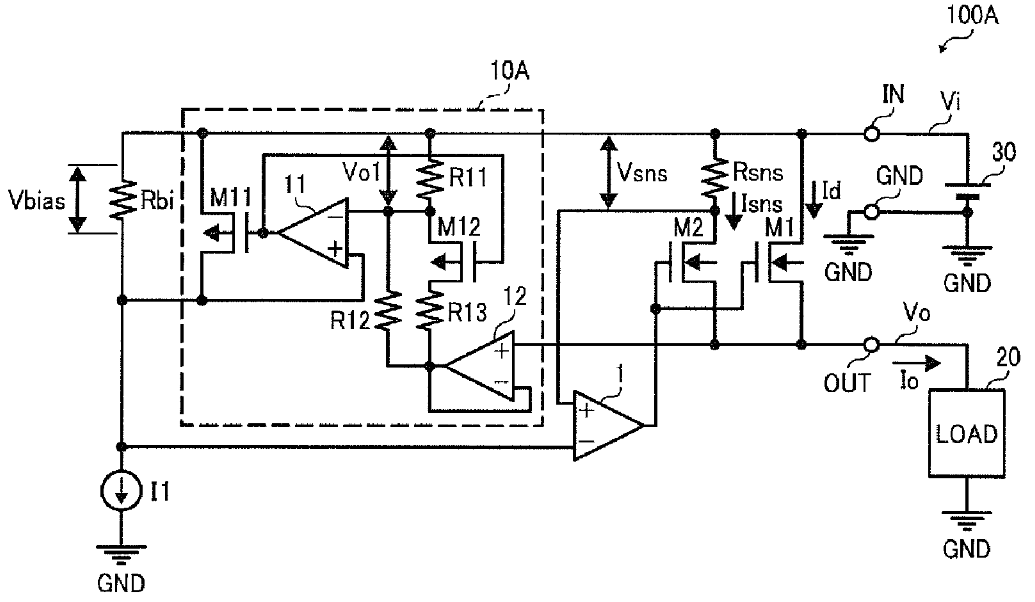
FIG. 3 illustrates circuitry of a current-restriction circuit according to another illustrative embodiment of the present invention.

FIG. 3 illustrates circuitry of a current-restriction circuit 100A that is different from the current-restriction circuit 100 shown in FIG. 1 in that, in a bias-voltage change circuit 10A, a series circuit including a PMOS transistor M12 and a resistor R13 serving as a second resistor is connected in parallel to the resistor R12, and that a gate of the PMOS transistor M12 is connected to the output terminal of the operational amplifier circuit 11. Other than the bias-voltage change circuit 10A, the current-restriction circuit 100A has a configuration similar to that of the current-restriction circuit 100 shown in FIG. 1, and thus the descriptions thereof are omitted.

In the present embodiment, the value of "N" in the formula 12' is changed according to the voltage difference by the series circuit including the PMOS transistor M12 and the resistor R13 connected in parallel to the resistor R12 in the bias-voltage change circuit 10A.

The gate of the PMOS transistor M12 is connected to an identical electrical potential to the gate of the PMOS transistor M11, and the electrical potential at the source of the PMOS transistor M12 is lower by the voltage Vo1 than that of the PMOS transistor M11. The voltage Vo1 is identical or similar to the bias voltage Vbias until the bias voltage Vbias becomes identical to the predetermined bias voltage Vbias0. Therefore, although the PMOS transistor M12 has relatively small impedance similarly to the PMOS transistor M11 when the bias voltage Vbias is close to 0 V, the impedance of the PMOS transistor M12 increases as the bias voltage Vbias increases. Then, the PMOS transistor M12 turns off when the bias voltage Vbias is at the predetermined bias voltage Vbias0.

As a result, the synthesized impedance of the circuit including the resistors R12 and R13, and the PMOS transistor M12 successively changes from the impedance for the state in which the resistors R12 and R13 are connected in parallel to the impedance for the state in which only the resistor R12 is connected. In other words, the value of "N" changes according to the voltage difference Vi−Vo. Thus, the maximum of the output current Io can be closer to the limited current Ilim from the range in which the voltage difference Vi−Vo is relatively small.

Figure 4:
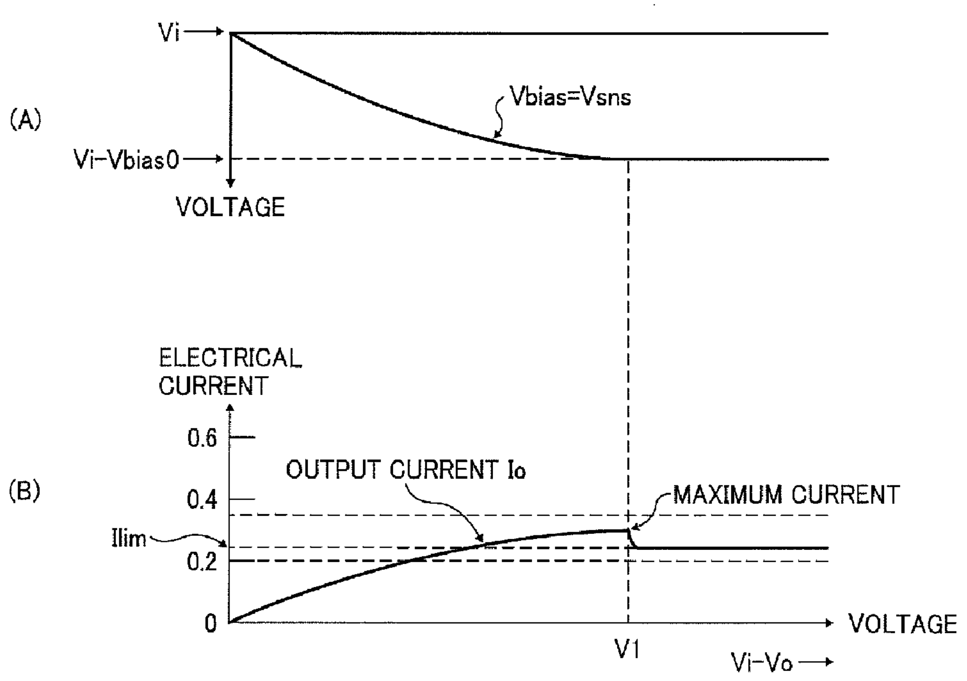
FIG. 4 illustrates the relation between voltage and current in the current-restriction circuit shown in FIG. 3: A graph (A) shows changes in the sense voltage Vsns and the bias voltage Vbias, and a graph (B) shows changes in the output current Io.

FIG. 4 illustrates the relation between voltage and current in the operations of the current-restriction circuit 100A shown in FIG. 3. In FIG. 4, a graph (A) shows changes in the sense voltage Vsns and the bias voltage Vbias, and a graph (B) shows changes in the output current Io similarly to those shown in FIG. 2 that illustrates the relation between voltage in the current-restriction circuit 100 shown in FIG. 1, and thus the descriptions thereof are omitted.

Referring to FIGS. 3 and 4, when the resistances of the resistors R11, R12, and R13 are identical or similar, "N" changes from 1.5 to 2. The graphs (A) and (B) shown in FIG. 4 show the relation between voltage and current in the current-restriction circuit 100A when other conditions are similar to those in the embodiment shown in FIGS. 1 and 2. As shown in FIG. 4, the changes in the bias voltage Vbias and the output current Io appear as curved lines.

As the maximum of "N" is 2 similarly to the embodiment shown in FIGS. 1 and 2, the voltage difference V1 at which the output current Io is maximum is 0.2 V similarly to the embodiment shown in FIGS. 1 and 2. In addition, as the maximum output current Imax is slightly larger than the limited current Ilim due to the channel modulation effects.

Thus, by increasing "N" gradually according to the voltage difference Vi−Vo, the maximum of the output current Io can be closer to the limited current Ilim from when the voltage difference Vi−Vo is relatively small.

It is to be noted that it is preferable that the ratio between the resistances of the resistors R11 and R13 be identical or similar to the ratio between the resistance of the sense resistor Rsns and the impedance of the sense transistor M2 when being on. The PMOS transistor M12 is included in the bias-voltage change circuit 10A to cancel fluctuations in the impedance of the sense transistor M2 caused by the operational amplifier circuit 1.

Yet another embodiment is described below with reference to FIGS. 5 and 6.

Figure 5:
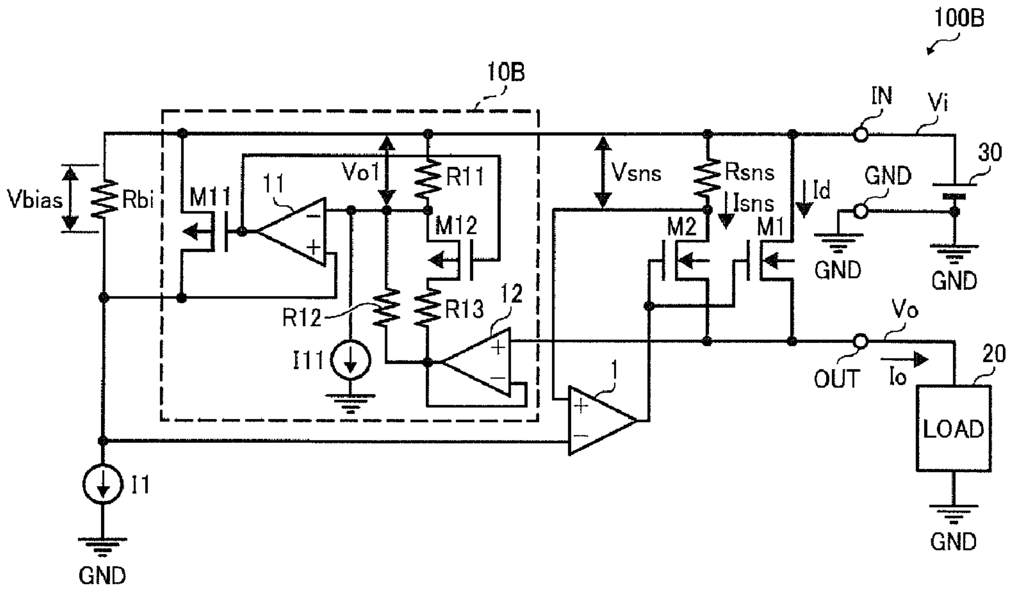
FIG. 5 illustrates circuitry of a current-restriction circuit according to another illustrative embodiment.

FIG. 5 illustrates circuitry of a current-restriction circuit 100B that is different from the current-restriction circuit 100A shown in FIG. 3 in that, in a bias-voltage change circuit 100B, a current source I11 is connected between the ground terminal GND and the junction node between the resistors R11 and R12. Other than that, the current-restriction circuit 100B has a configuration similar to that of the current-restriction circuit 100A shown in FIG. 3, and thus the descriptions thereof are omitted.

In the present embodiment, the value of "N" in the formula 12' is changed according to the voltage difference by the series circuit including the PMOS transistor M12 and the resistor R13 connected in parallel to the resistor R12 in the bias-voltage change circuit 10A.

In the present embodiment, the current source I11 constantly supplies a bias current I11 from the junction node between the resistors R11 and R12. Thereby, the voltage Vo1 does not become 0 V even when the voltage difference Vi−Vo is 0 V. Similarly, even when the voltage difference Vi−Vo is 0 V, the bias voltage Vbias is not 0 V but a constant voltage that is hereinafter referred to as a lower limit Vb0 of the bias voltage. Adding the lower limit Vb0 of the bias voltage to the current-restriction circuit 100B can cancel variations in the circuit elements. In other words, the lower limit Vb0 of the bias voltage can be set according to the variations to be cancelled. Examples of the variations in the circuit elements include an offset of the operational amplifier circuit 1.

The voltage Vo1 can be obtained from formula 14 shown below.

$$Vo1=[I11\cdot R11\cdot R23+(Vi-Vo)R11]/(R11+R23) \tag{14}$$

wherein I11 represents the current value of the current source I11, R11 represents the resistance of the resistor R11, and R23 represents a synthesized resistance of the PMOS transistor M12 and the resistors R12 and R13.

Herein, when the resistance ratio of the resistors R11, R12, and R13 is 1:2:2, the synthesized resistance R23 changes from 1 to 2. When the voltage difference Vi−Vo is 0 V, the synthesized resistance R23 is 1.

Figure 6:
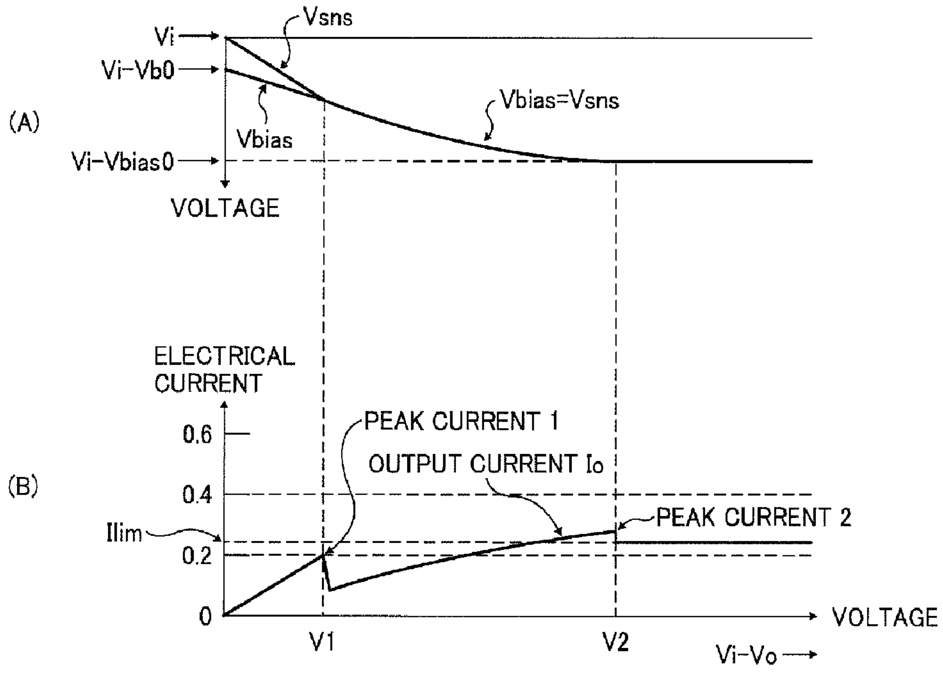
FIG. 6 illustrates the relation between voltage and current in the current-restriction circuit shown in FIG. 5: A graph (A) shows changes in the sense voltage Vsns and the bias voltage Vbias, and a graph (B) shows changes in the output current Io.

FIG. 6 illustrates the relation between voltage and current in the operations of the current-restriction circuit 100B shown in FIG. 5. In FIG. 6, a graph (A) shows changes in the sense voltage Vsns and the bias voltage Vbias, and a graph (B) shows changes in the output current Io similarly to those shown in FIG. 2 that illustrates the relation between voltage in the current-restriction circuit 100 shown in FIG. 1, and thus the descriptions thereof are omitted.

The graphs (A) and (B) shown in FIG. 6 show the relation between voltage and current in the current-restriction circuit 100B when the current value of the current source I11 is 0.003 and other conditions are similar to those in the embodiment shown in FIGS. 1 and 2.

As it is known from FIG. 6, when the voltage difference Vi−Vo is 0, the bias voltage Vbias is not 0 V but Vb0, which is 0.015 V under those conditions according to the above-described formula 14.

Moreover, the output current Io has two peaks. The output current Io reaches a first peak current 1 when the voltage difference is V1 at which the bias voltage Vbias is identical to the sense voltage Vsns. The output current Io reaches a second peak current 2 when the voltage difference is V2 at which the bias voltage Vbias is the predetermined bias voltage Vbias0.

The voltage difference V1 as well as the value of the first peak current 1 can be changed by changing the current value of the current source I11 and the combination of the resistors R1 through R13. Under the above-described conditions, the voltage difference V1 is 0.035 V and the output current Io at that time (peak current 1) is 0.21 A, which is close to the limited current Ilim of 0.22 A. Additionally, the output current Io reaches the second peak current 2 when the voltage difference V2 is 0.24 V. Although it is expected that the maximum output current Imax at that time will be identical to the limited current Ilim, the maximum output current Imax actually is larger than the limited current Ilim slightly due to the channel modulation effects and the like.

According to the present embodiment, variations such as the offset of the operational amplifier circuit 1 can be cancelled by the lower limit Vb0 of the bias voltage.

Yet another embodiment is described below with reference to FIGS. 7 and 8.

Figure 7:
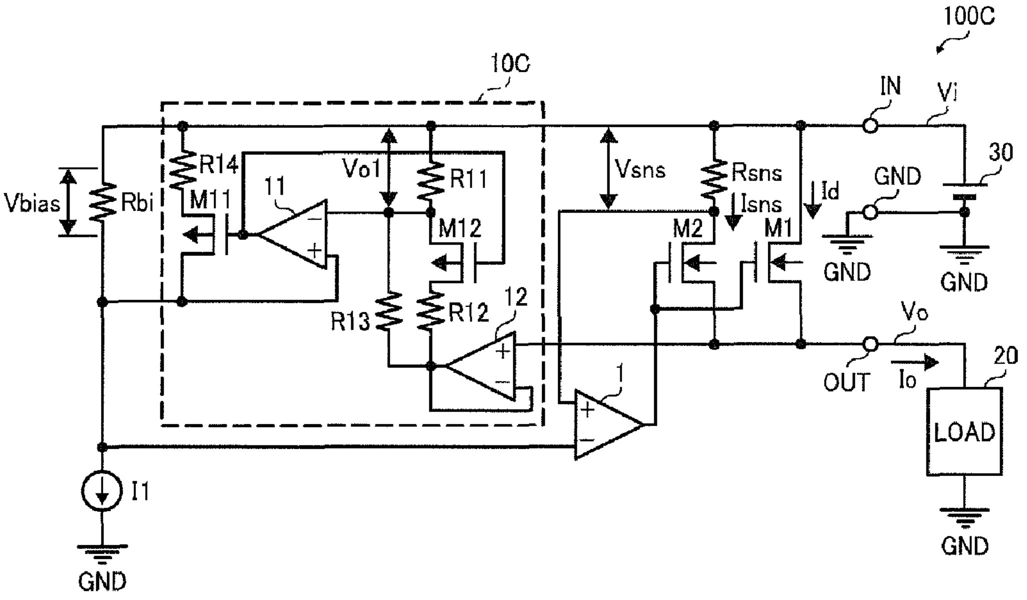
FIG. 7 illustrates circuitry of a current-restriction circuit according to another illustrative embodiment.

FIG. 7 illustrates circuitry of a current-restriction circuit 100C that is different from the current-restriction circuit 100A shown in FIG. 3 in that, in a bias-voltage change circuit 10C, a resistor R14 is connected between the drain of the PMOS transistor 11 and the input terminal IN. Other than the bias-voltage change circuit 10C, the current-restriction circuit 100C has a configuration similar to that of the current-restriction circuit 100A shown in FIG. 3, and thus the descriptions thereof are omitted.

In the present embodiment, when the PMOS transistor M11 turns on, that is, the voltage difference Vi−Vo is 0 V, the resistor R14 is connected in parallel to the bias resistor Rbi, and the current source I1 supplies electrical current to a synthesized resistance of the resistor R14 and the bias resistor Rbi. Therefore, even when the PMOS transistor M11 turns on, that is, the voltage difference Vi−Vo is 0 V, the minimum of the bias voltage Vbias can be set to a predetermined or given lower limit Vb0 not 0 V.

Figure 8:
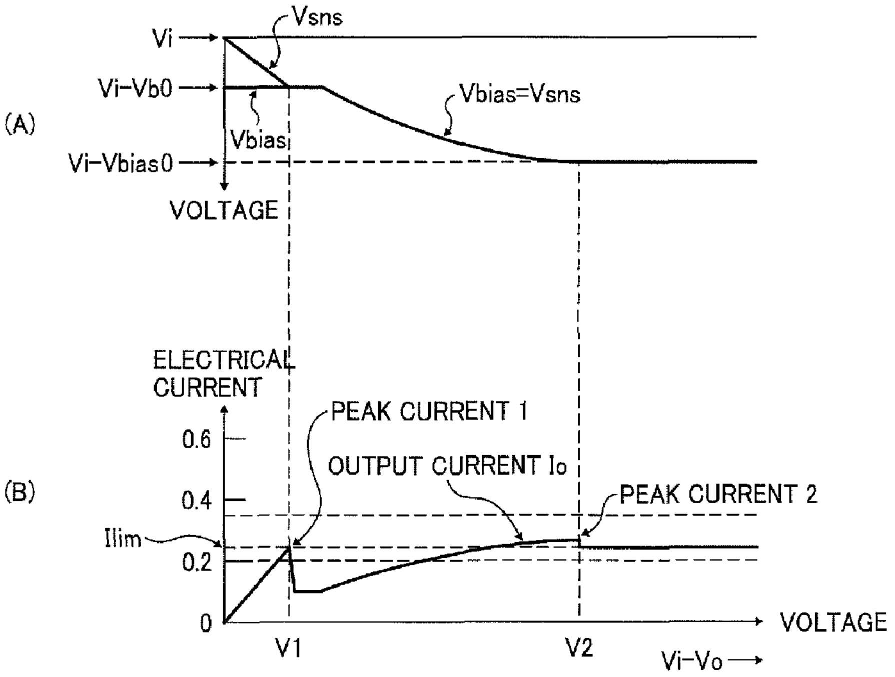
FIG. 8 illustrates the relation between voltage and current in the current-restriction circuit shown in FIG. 7: A graph (A) shows changes in the sense voltage Vsns and the bias voltage Vbias, and a graph (B) shows changes in the output current Io.

In FIG. 8, a graph (A) shows changes in the sense voltage Vsns and the bias voltage Vbias, and a graph (B) shows changes in the output current Io in the operations of the current-restriction circuit 100C shown in FIG. 7.

The graphs (A) and (B) shown in FIG. 8 show the relation between voltage and current in the current-restriction circuit 100C when the resistor R14 has a resistance of 0.3Ω and other conditions are similar to those in the embodiment shown in FIGS. 3 and 4.

As shown in FIG. 8, when the voltage difference Vi−Vo is 0 V, the bias voltage Vbias is not 0 V but the predetermined lower limit Vb0. Because the lower limit Vb0 of the bias voltage is obtained by multiplying the synthesized resistance of the bias resistor Rbi and the resistor R14 with the current value of the current source I1, the lower limit Vb0 can be expressed by formula 15 shown below.

$$Vb0=I1\cdot Rbi\cdot R14/(Rbi+R14) \tag{15}$$

When the parameters in the formula 15 is replaced with above-described values, $$Vb0=0.1\times1\times0.3/(1+0.3)\approx0.023\text{ V.}$$

Also in the present embodiment, similarly to the embodiment shown in FIGS. 5 and 6, the output current Io has two peaks. The output current Io reaches the first peak current 1 when the voltage difference is V1 at which the bias voltage Vbias is identical to the sense voltage Vsns and then reaches the second peak current 2 when the voltage difference is V2 at which the bias voltage Vbias is the predetermined bias voltage Vbias0.

The voltage difference V1 as well as the value of the first peak current 1 can be changed by changing the current value of the current source I11 and the combination of the resistors R1 through R14. Under the above-described conditions, the voltage difference V1 is 0.03 V and the output current Io at that time (peak current 1) is 0.21 A, which is close to the limited current Ilim of 0.22 A. Additionally, the output current Io reaches the second peak current 2 when the voltage difference V2 is 0.2 V. Although it is expected that the maximum output current Imax at that time will be identical to the limited current Ilim, the maximum output current Imax actually is larger than the limited current Ilim slightly due to the channel modulation effects and the like.

Also in the present embodiment, variations such as the offset of the operational amplifier circuit 1 can be cancelled by the lower limit Vb0 of the bias voltage.

Yet another embodiment is described below with reference to FIG. 9.

Figure 9:
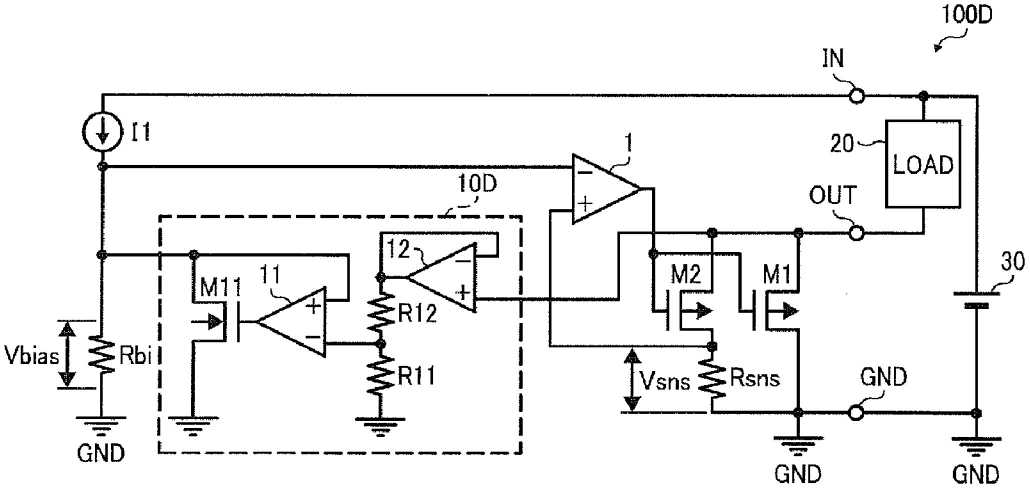
FIG. 9 illustrates circuitry of a current-restriction circuit according to another illustrative embodiment.

FIG. 9 illustrates circuitry of a current-restriction circuit 100D in which conduction type of the MOS transistors M1 and M2, and that of a transistor M11 in a bias-voltage change circuit 10D are opposite those in the current-restriction circuit 100 shown in FIG. 1. Therefore, the driver transistor M1 is connected between the ground voltage GND and the output terminal OUT, and the load 20 is connected between the input terminal IN and the output terminal OUT. In other circuits, the connecting relations between the input voltage Vi and the ground voltage GND are opposite those in the current-restriction circuit 100 shown in FIG. 1.

The operations of the current-restriction circuit 100D and a bias-voltage change circuit 10D therein are similar to the current-restriction circuit 100 shown in FIG. 1, and thus the descriptions thereof are omitted.

Needless to say, the current-restriction circuits 100A, 100B, and 100C shown in FIGS. 3, 5, and 7, respectively, can be configured using MOS transistors of the opposite conduction type.

Yet another embodiment is described below with reference to FIG. 10.

Figure 10:
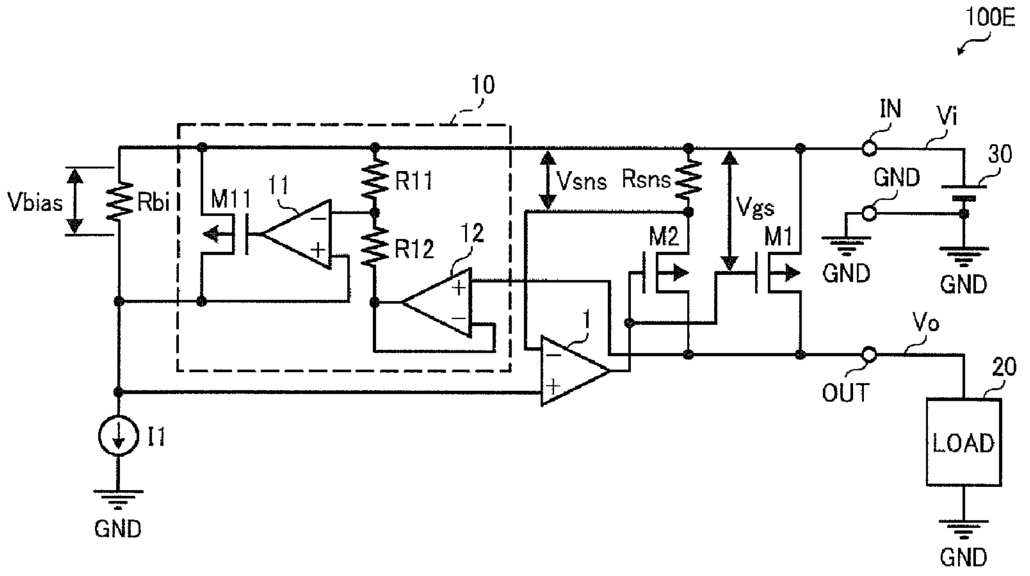
FIG. 10 illustrates circuitry of a current-restriction circuit according to another illustrative embodiment.

FIG. 10 illustrates circuitry of a current-restriction circuit 100E in which the driver transistor M1 and the sense transistor M2 shown in FIG. 1 are replaced with PMOS transistors.

In FIG. 10, the source of the driver transistor M1 is connected to the input terminal IN, and the drain thereof is connected to the output terminal OUT. The source of the sense transistor M1 is connected to the input terminal IN via the sense resistor Rsns, and the drain thereof is connected to the output terminal OUT.

In addition, the inverting input terminal of the operation amplifier circuit 1 is connected to the junction node between the source of the sense transistor M2 and the sense resistor Rsns, and the bias voltage Vbias is input to the non-inverting input terminal thereof.

In the current-restriction circuit 100E, the voltage between the gate and the source (hereinafter "gate-source voltage") of the sense transistor M2 is lower than the gate-source voltage of the driver transistor M1 by the sense voltage Vsns. Therefore, the on resistance of the sense transistor M2 should be adjusted.

When the gate-source voltage of the driver transistor M1 is Vgs, the impedance of the sense transistor M2 shown in FIG. 1 is Rs, and the impedance of the sense transistor M2 shown in FIG. 10 is Rss, the relation between the impedances Rs and Rss can be expressed by formula 16 shown below.

$$Rss=Rs\cdot Vgs/(Vgs-V\text{bias}) \tag{16}$$

When the gate-source voltage Vgs of the driver transistor M1 is 1 V, and the bias voltage Vbias is 0.1 V, the impedance Rss of the sense transistor M2 shown in FIG. 10 can be expressed by formula 17 shown below.

$$Rss \approx 1.11 \cdot Rs \tag{17}$$

When the impedance Rs in the formula 1 is substituted with the above-described impedance Rss, and other conditions are similar to those in the embodiment shown in FIG. 1, the limited current Ilim can be obtained as follows.

$$Ilim = 0.1(0.1 + 1.11 \times 1)/0.1 \times 5 = 0.242\ A$$

Although the limited current Ilim is greater by about 10% compared with the current-restriction circuit 100 shown in FIG. 1, the limited current Ilim can be adjusted to that in the current-restriction circuit 100 shown in FIG. 1 by changing the resistance of the sense resistor Rsns.

By only adjusting the gate-source voltage of the sense transistor M2 as described above, the current-restriction circuit 100E and the bias-voltage change circuit 10 can operate similarly to those shown in FIG. 1.

Needless to say, any of the bias-voltage change circuits 10A, 10B, and 10C respectively shown in FIGS. 3, 5, and 7 can be used in the current-restriction circuit 100E shown in FIG. 10.

Yet another embodiment is described below with reference to FIG. 11.

Figure 11:
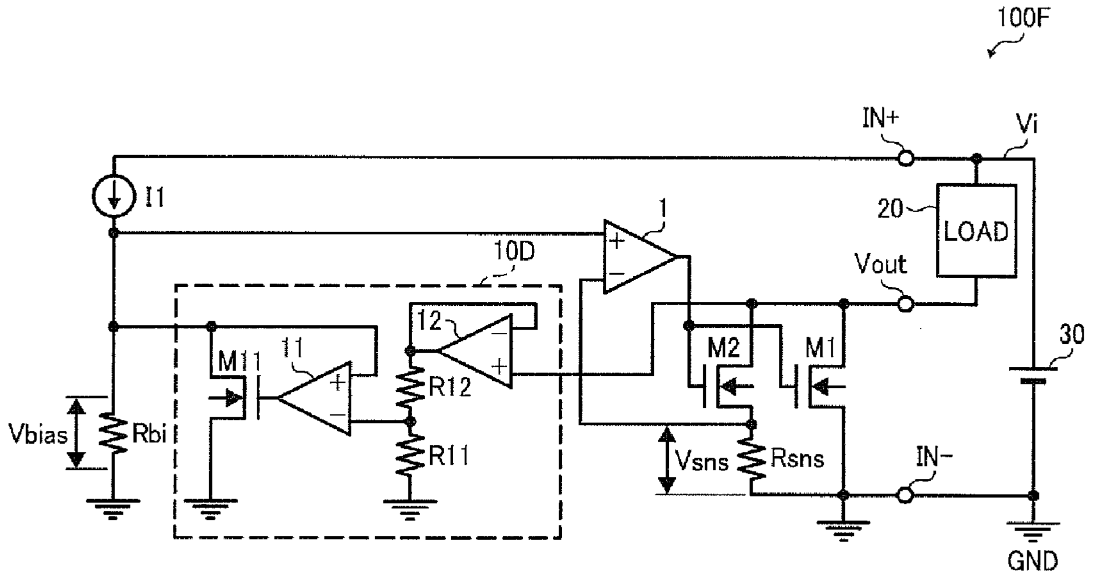
FIG. 11 illustrates circuitry of a current-restriction circuit according to another illustrative embodiment.

FIG. 11 illustrates circuitry of a current-restriction circuit 100F in which conduction type of the MOS transistors M1 and M2, and that of a transistor M11 in a bias-voltage change circuit 10D are opposite those in the current-restriction circuit 100E shown in FIG. 10. Therefore, the driver transistor M1 is connected between the ground voltage GND and the output terminal OUT, and the load 20 is connected between the input terminal IN and the output terminal OUT. In other circuits, the connecting relations between the input voltage Vi and the ground voltage GND are opposite those in the current-restriction circuit 100E shown in FIG. 10.

The operation of the current-restriction circuit 100F is similar to the current-restriction circuit 100E shown in FIG. 10, and thus the description thereof is omitted.

Needless to say, any of the bias-voltage change circuits 10A, 10B, and 10C respectively shown in FIGS. 3, 5, and 7 can be used also in the present embodiment.

As described above, according to the embodiments shown in FIGS. 1 to 8, the bias voltage Vbias is changed according to the difference between the input voltage Vi and the output voltage Vo. Similarly, according to the embodiments shown in FIGS. 9 to 11, in which the conduction type of the MOS transistors are reversed, the bias voltage Vbias is changed according to the difference between the output voltage Vo and the ground voltage. Therefore, even in the range where the voltage difference is relatively small, the output current Io can be kept similar to or lower than the limited current Ilim. As a result, the allowable current values regarding the circuit elements can be alleviated, and thus the area as well as the cost of the circuit can be reduced.

Numerous additional modifications and variations are possible in light of the above teachings. It is therefore to be understood that, within the scope of the appended claims, the disclosure of this patent specification may be practiced otherwise than as specifically described herein.

What is claimed is:

1. A current-restriction circuit comprising:
an input terminal to which an input voltage is input;
an output terminal from which an output voltage is output;
a driver transistor including a first end connected to the input terminal, a second end connected to the output terminal, and a control terminal;
a sense transistor including a first end connected to the input terminal via a sense resistor, a second end connected to the output terminal, and a control terminal connected to the control terminal of the driver transistor;
a first operational amplifier circuit to which both a bias voltage with reference to an electrical potential at the input terminal and a decrease in a voltage at the sense resistor are input, having an output terminal connected to the control terminals of the driver transistor and the sense transistor; and
a bias-voltage change circuit to keep the bias voltage below a predetermined bias voltage according to a voltage difference between the input voltage and the output voltage.

2. The current-restriction circuit according to claim 1, wherein the bias-voltage change circuit decreases the bias voltage as the voltage difference between the input voltage and the output voltage decreases.

3. The current-restriction circuit according to claim 2, wherein, until the bias voltage reaches the predetermined bias voltage, the bias-voltage change circuit adjusts the bias voltage to a voltage obtained by dividing the voltage difference between the input voltage and the output voltage by a factor N that is greater than 1.

4. The current-restriction circuit according to claim 3, wherein the bias-voltage change circuit changes the factor N according to the voltage difference between the input voltage and the output voltage.

5. The current-restriction circuit according to claim 2, wherein a lower limit is set on the bias voltage.

6. The current-restriction circuit according to claim 1, further comprising:
a bias resistor including a first end connected to the input terminal; and
a variable impedance element connected in parallel to the bias resistor,
wherein the bias voltage is generated by supplying a predetermined electrical current to the bias resistor, and
the bias-voltage change circuit adjusts the impedance of the variable impedance element according to the voltage difference between the input voltage and the output voltage.

7. The current-restriction circuit according to claim 6, wherein the variable impedance element is a first MOS transistor.

8. The current-restriction circuit according to claim 7, wherein the bias-voltage change circuit further comprises a second operational amplifier circuit including a first input terminal to which the bias voltage is input, a second input terminal to which a voltage obtained by dividing the voltage difference by a first resistor is input, and an output terminal connected to a gate of the first MOS transistor.

9. The current-restriction circuit according to claim 7, wherein the bias-voltage change circuit further comprises:
a second operational amplifier circuit including a first input terminal to which the bias voltage is input, a second input terminal to which a voltage obtained by dividing the voltage difference by a first resistor is input, and an output terminal connected to a gate of the first MOS transistor; and
a second resistor and a second MOS transistor connected serially between the second input terminal of the second operational amplifier circuit and the output terminal, wherein a conduction type of the second MOS transistor is identical to that of the first MOS transistor.

10. The current-restriction circuit according to claim 1, wherein the driver transistor and the sense transistor are MOS transistors whose conduction types are identical, and sources of the driver transistor and the sense transistor are connected to the output terminal.

11. The current-restriction circuit according to claim 1, wherein the driver transistor and the sense transistor are MOS transistors whose conduction types are identical, and drains of the driver transistor and the sense transistor are connected to the output terminal.

12. A method of driving a current-restriction circuit, the current-restriction circuit comprising:

an input terminal to which an input voltage is input;

an output terminal from which an output voltage is output;

a driver transistor including a first end connected to the input terminal, a second end connected to the output terminal, and a control terminal;

a sense transistor including a first end connected to the input terminal via a sense resistor, a second end connected to the output terminal, and a control terminal connected to the control terminal of the driver transistor; and a first operational amplifier circuit to which both a bias voltage with reference to an electrical potential at the input terminal and a decrease in a voltage at the sense resistor are input, having an output terminal connected to the control terminals of the driver transistor and the sense transistor, the method comprising:

keeping the bias voltage below a predetermined bias voltage according to a voltage difference between the input voltage and the output voltage.

* * * * *